(12) United States Patent
Petr

(10) Patent No.: US 7,224,158 B2
(45) Date of Patent: May 29, 2007

(54) CIRCUIT ARRANGEMENT AND A METHOD FOR COMPENSATING CHANGES OF A TRANSFER FACTOR OF A MAGNETIC FIELD SENSOR ARRANGEMENT

(75) Inventor: Jan Petr, Oberwil (CH)

(73) Assignee: Landis+Gyr AG, Zug (CH)

( * ) Notice: Subject to any disclaimer, the term of this patent is extended or adjusted under 35 U.S.C. 154(b) by 142 days.

(21) Appl. No.: 10/999,198

(22) Filed: Nov. 29, 2004

(65) Prior Publication Data

US 2005/0156588 A1 Jul. 21, 2005

Related U.S. Application Data

(63) Continuation of application No. PCT/EP03/04908, filed on May 12, 2003.

(30) Foreign Application Priority Data

May 29, 2002 (DE) ................. 102 24 354

(51) Int. Cl.
*G01R 15/20* (2006.01)
(52) U.S. Cl. ................. 324/117 R
(58) Field of Classification Search ............... None
See application file for complete search history.

(56) References Cited

U.S. PATENT DOCUMENTS 3,219,909 A    11/1965   Foster

| 4,586,124 | A  | * | 4/1986  | Wiederstein ............... 700/56 |
| 4,742,296 | A  | * | 5/1988  | Petr et al. ................ 324/142 |
| 4,752,733 | A  | * | 6/1988  | Petr et al. ................ 324/225 |
| 4,972,141 | A  | * | 11/1990 | Rozman et al. ............. 324/142 |
| 5,349,676 | A  | * | 9/1994  | Garverick et al. ........... 712/36 |
| 5,477,135 | A  | * | 12/1995 | Baker ...................... 324/130 |
| 5,640,085 | A  | * | 6/1997  | Petr et al. ................ 324/105 |
| 5,736,848 | A  | * | 4/1998  | De Vries et al. ........... 324/142 |
| 6,285,304 | B1 | * | 9/2001  | Schweighofer ............. 341/118 |
| 6,817,760 | B2 | * | 11/2004 | Mende et al. .............. 374/152 |

FOREIGN PATENT DOCUMENTS

EP          0 172 402          2/1986

* cited by examiner

*Primary Examiner*—Vinh Nguyen
*Assistant Examiner*—Richard Isla-Rodas
(74) *Attorney, Agent, or Firm*—Maginot, Moore & Beck

(57) ABSTRACT

The invention relates to a circuit configuration for compensating for the changes in a transfer ratio of a magnetic field sensor arrangement. According to one embodiment of the invention, a control loop for effecting this compensation is provided in the form of an integrated circuit whereby the change in transfer ratio is compensated by means of a control signal variation. This circuit configuration includes a series configuration of an A/D converter, a digital controller and a D/A converter exhibiting high precision and high control speed. A control that is significantly more precise and faster than that of the prior art is achieved by virtue of the fact that only a variable portion of regulating variables is fed through the digital controller after which a constant portion of regulating variables for the actual regulating variable used for compensation is added.

9 Claims, 2 Drawing Sheets

CIRCUIT ARRANGEMENT AND A METHOD FOR COMPENSATING CHANGES OF A TRANSFER FACTOR OF A MAGNETIC FIELD SENSOR ARRANGEMENT

CROSS-REFERENCE TO RELATED APPLICATIONS

This application is a continuation of PCT application No. PCT/EP03/04908, filed May 12, 2003.

FIELD OF THE INVENTION

The invention relates generally to the field of magnetic field sensors and more specifically to a circuit arrangement and method for compensating for changes of a transfer factor of a magnetic field sensor arrangement.

BACKGROUND

It is known to measure an electrical current without any potential via the magnetic field produced by it. Magnetic field sensors, e.g. Hall sensors, magneto-transistors or other semiconductor elements serve for determining the strength of the magnetic field, and these produce an output signal which is more or less proportional to the magnetic field. In order to avoid the influence of non-linearities and changes of the transfer factor of a magnetic field sensor, special circuit arrangements and methods able to be carried out by these have been applied.

EP 0 172 402 A1 for example discloses a circuit arrangement with which the fluctuations in the transfer factor of a magnetic field sensor may be compensated. For this one envisages superimposing a known auxiliary magnetic field on the magnetic field to be measured, wherein both fields are detected by the magnetic field sensor. At the output side of the magnetic field sensor the signal is supplied to a summing element in a manner such that the component of the auxiliary magnetic field may be filtered out. This signal component which may be traced to the auxiliary magnetic field is transferred to a correlator whose second input is a current generator voltage which provides the current producing the auxiliary magnetic field.

A regulator is arranged on the exit side of this correlator, which provides a control signal for the magnetic field sensor burdened with fluctuations which are compensated for in this manner.

At the same time it may be seen to be of a disadvantage that the accuracy and control speed of this conventional compensation circuit is limited. Furthermore the compensation circuit is built up at least partly of discrete, analog components which entails a corresponding installation expense with regard to space and manufacture.

SUMMARY

It is therefore the object of the invention to further develop the known circuit arrangement to the extent that the desired compensation of the changes of the transfer factor of a magnetic field sensor arrangement is effected in a more accurate and quicker maimer, and furthermore that a simplification of the circuit also leads to a more economical effect. Furthermore an optimisation of the control (regulation) range of a regulator serving for the compensation is desired, which may be equated with a reduction of the control (regulation) range. A smaller control (regulation) range as is known, entails an effective improvement of the signal-to-noise ratio and thus a significant improvement of the compensation behaviour of the whole circuit arrangement with respect to the cited state of the art.

It is further the object of the invention to provide a method with which a precise and quick compensation of the changes of the transfer factor of a magnetic field sensor arrangement may be carried out. An optimisation of the control (regulation) range of a regulator serving for the compensation is also sought after, which is equivalent to a reduction of the control (regulation) range.

With regard to the circuit arrangement according to the invention for compensating the changes of the transfer factor of a magnetic field sensor arrangement, one must particularly emphasise the formation of a control loop for this compensation in digital technology—constructed as an integrated circuit—wherein the change of the transfer factor is compensated by way of the regulation signal deviation. The advantage of this circuit arrangement is the high accuracy and the higher control speed of the control loop with a series circuiting of an A/D converter, a digital regulator and a D/A converter. With this one achieves a control which is significantly more accurate and quicker with respect to the state of the art in that only one variable regulating variable component is led via the digital regulator and only thereafter is a constant regulating variable component added to the actual regulating variable which serves for the compensation. For this, either before the A/D conversion an analog, individually settable desired value or afterwards a digital, individually settable desired value is subtracted from the actual value signal led to the digital regulator, so that a correspondingly smaller actual value signal deviation reaches the digital regulator.

On subtraction before the A/D conversion advantageously an individually settable, attenuated auxiliary generator signal is available which is already used for producing the additional auxiliary magnetic field at the magnetic field sensor arrangement.

Advantageously an individually settable digital desired value serves for the subtraction after the A/D conversion.

By way of these two design directions of the invention, the digital regulator may be operated in a control (regulation) range which is significantly smaller with respect to the state of the art, by which means its signal-to-noise ratio is considerably improved. By way of this the digital regulator is not only more accurate but furthermore displays a significantly higher control speed.

A further improvement of the signal-to-noise ratio and of the control speed of the digital regulator is achieved in that in the new condition either the individually settable, attenuated, auxiliary generator signal or the individually settable desired value are set such that the digital regulator is set in the middle of its control (regulation) range. In this simple manner an adaptation of the complete circuit arrangement may be effected for the purpose of compensating sample scatter. These circuit variants according to the inventions permit a further reduction of the digital control (regulation) range and thus a further improvement with regard to accuracy and control speed.

The use of the digital regulator according to the invention also allows a somewhat less accurate but in return a particularly quick control to steady state with each new start of the circuit arrangement. In a first operating period, an increased transfer factor may be led to the digital regulator in a simple, digital manner, by which means it is controlled to steady state very quickly and sufficiently accurately within the first 5 seconds. Subsequently the transfer factor is reduced for the required quick and accurate control to steady state which is required in the condition of permanent operation.

As already mentioned above, at the output side of the digital regulator, a constant regulating variable component is added to the variable regulating variable component. Two advantageous designs may be selectively used with regard to this.

One first—directly compensating—variant envisages transforming the voltage signal of the variable regulating variable component in a control element into a variable regulating variable current component, adding a constant regulating variable component to this and subsequently leading it directly to the magnetic field sensors for the purpose of the compensation of the change of its transfer factor. The output-side useful signal of the magnetic field sensor arrangement with the directly compensating variant is a compensated analog signal which may be used as such or may be led to an A/D conversion.

A second—indirectly compensating—variant envisages adding a constant regulating variable component to the voltage signal of the variable regulating variable component and subsequently leading it as a reference signal to the A/D converter or converters connected after the magnetic field sensor arrangement, in order to indirectly effect a compensation of the change of the transfer factor of the magnetic field sensors. The output-side useful signal with the indirectly compensating variant is a compensated, digital signal after the A/D converter used for the compensation.

Those further features which advantageously further develop the invention with regard to the circuit arrangement are to be deduced from the following description of the embodiment examples.

Since the advantages with regard to the method are directly linked to those of the circuit arrangement, and the virtues of this circuit arrangement have already been mentioned above, a repetition of these is avoided here.

BRIEF DESCRIPTION OF THE DRAWINGS

Advantages and details of the invention with regard to a circuit arrangement and method according to principles of the present invention are hereinafter described in more detail and by way of the embodiment examples. These are shown in.

DETAILED DESCRIPTION

Figure 1:
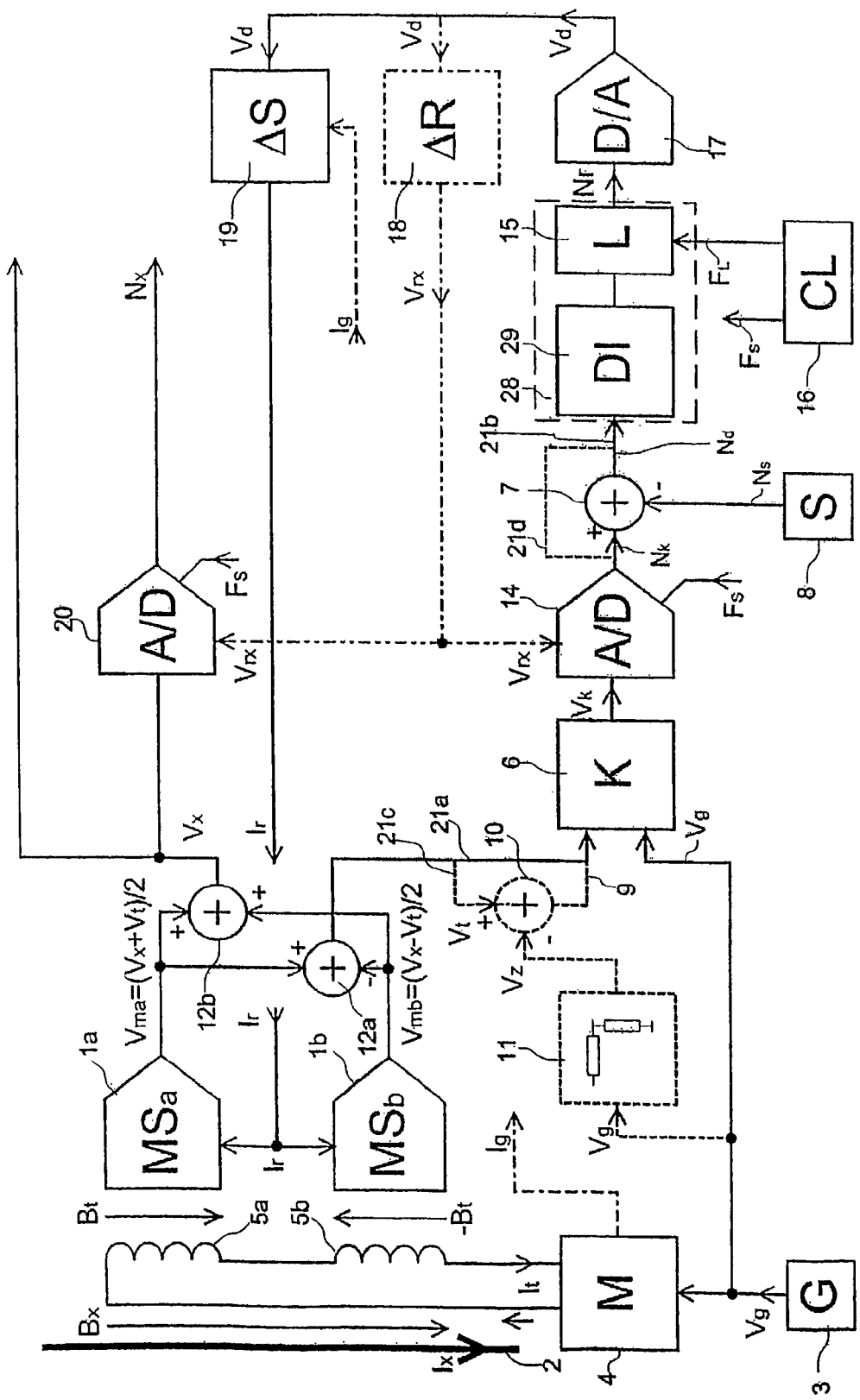
FIG. 1 a block diagram of a circuit arrangement according to the invention for the compensation of the change of the transfer factor of a magnetic field sensor arrangement.

FIG. 1 shows a circuit arrangement according to the invention with a magnetic field sensor arrangement, consisting of two magnetic field sensors 1a, 1b (MSa, MSb). These magnetic field sensors 1a, 1b are both subjected to a magnetic field Bx of a measurement current Ix to be detected, which flows through a current lead 2. Furthermore, the magnetic field sensors 1a, 1b are subjected to anti-parallel auxiliary magnetic fields Bt, −Bt of the same magnitude. An auxiliary current It via a suitable auxiliary coil arrangement 5a, 5b produces these auxiliary magnetic fields Bt, −Bt. The auxiliary coil 5a couples the auxiliary magnetic field Bt produced by the auxiliary current It onto the first magnetic field sensor 1a and the auxiliary coil 5b subjects the second magnetic field sensor 1b to an auxiliary magnetic field −Bt which is likewise produced by the same auxiliary current It and which is the same size as the auxiliary magnetic field Bt but is anti-parallel to this.

The auxiliary current It producing the auxiliary magnetic fields Bt −Bt is produced by way of a voltage-current transducer 4 (M). This voltage-current transducer 4 generates the auxiliary current It in dependence on a voltage Vg which is supplied to it from an auxiliary signal generator 3 (G).

At the output side, the magnetic field sensors 1a, 1b are connected to a summing element 12a which itself on the output side is connected to a correlator 6 via a connection 21a. At its second input the correlator 6 has a connection to the auxiliary signal generator 3, wherein here the same voltage signal Vg which is already used on producing the auxiliary current It prevails.

In the series connection, at the output side of the correlator 6 there follows a first A/D converter 14, a digital regulator 28 and a D/A converter 17. For the purpose of setting the desired value, in a first variant, a desired value generator 8 (S) is arranged between the first A/D converter 14 and the digital regulator 28 by way of a connection 21b and a further summing element 7 which in the following is called the fourth summing element 7.

According to the invention, the output signal Vd of the D/A converter 17 serves as a variable regulating variable component of the compensation of the changes of the transfer factor of the magnetic field sensors 1a, 1b. Without departing from this inventive concept, with regard to circuit technology two variants may be carried out after the D/A converter. A first variant is indicated characteristically as a "direct compensation, and a further variant in the following is descriptively called an "indirect compensation".

Figure 3:
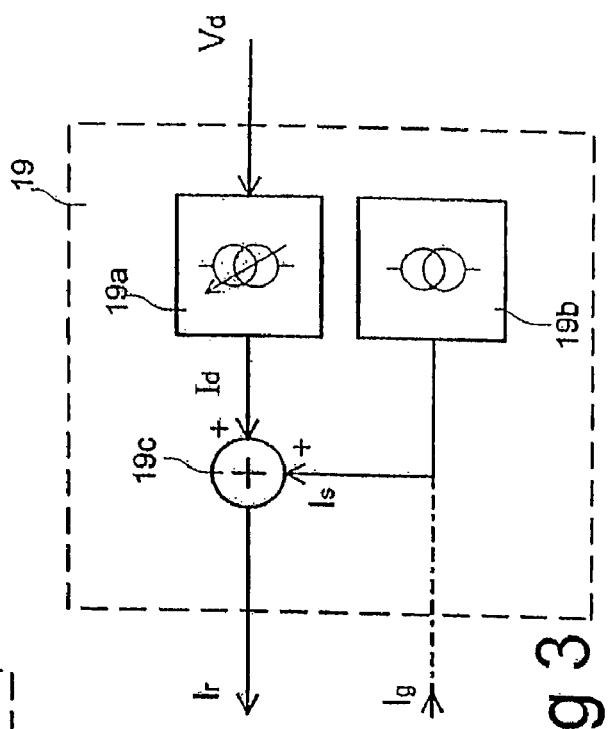
FIG. 3 a detailed view of a control element of the circuit arrangement.
Figure 2:
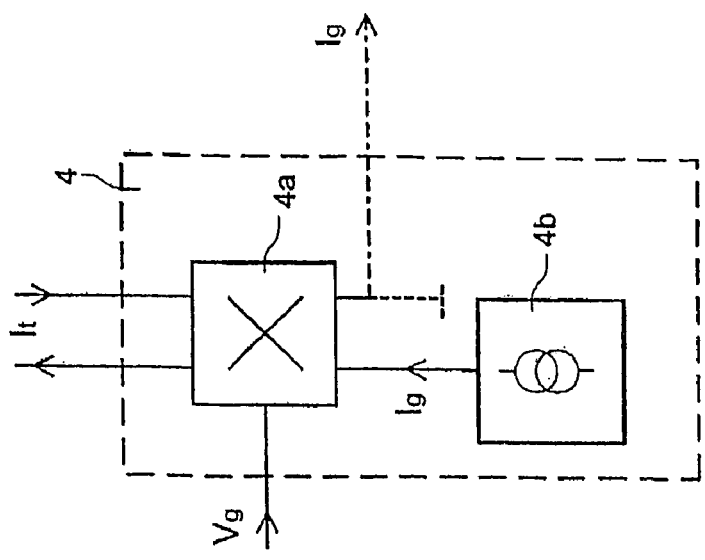
FIG. 2 a detailed view of a voltage-current transducer of the circuit arrangement.

With the direct compensation, the D/A converter 17 is connected via a first control element 19 (ΔS) to the magnetic field sensors 1a, 1b, and specifically to the control signal input of these sensors. The control element 19 is represented in FIG. 3 in a more detailed manner. Here it is evident that the output signal Vd of the D/A converter is led to a voltage-controlled current source 19a. A constant current component Is is added to the output-side current signal Id of the current source 19a by way of a sixth summing element 19c. At the same time this constant current component Is may be supplied from an auxiliary current source 19b, or the sixth summing element 19c is connected to a current output signal Ig of the voltage-current transducer 4 as is illustrated in FIG. 2. The voltage-current transducer comprises a voltage-controlled current source 4b and a function circuit 4a connected thereafter from which this auxiliary current Ig may be taken as a constant current component.

Figure 4:
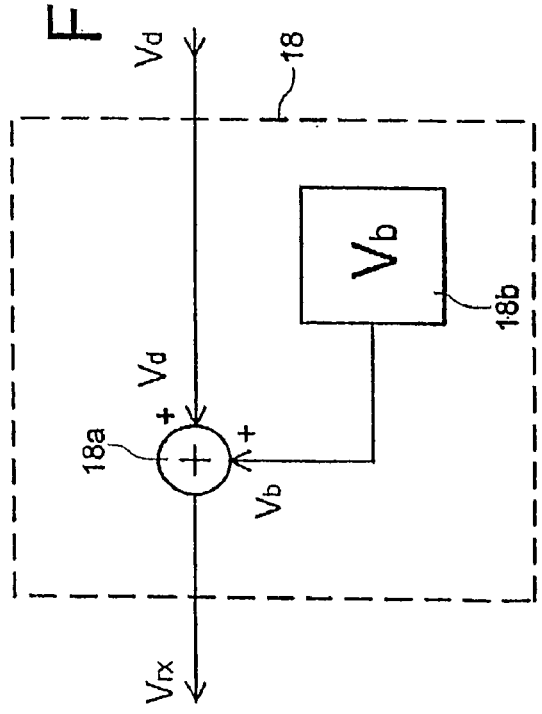
FIG. 4 a detailed view of a further control element of the circuit arrangement.

With the further variant according to the invention, the indirect compensation, it is envisaged for the D/A converter 17 to be connected to a second control element 18. This, as FIG. 4 shows, comprises a third summing element 18a with which an auxiliary voltage source 18b leads a constant auxiliary voltage Vb to the output signal Vd of the D/A converter. The sum signal Vrx of the third summing element 18a is connected to the first A/D converter and to a further, second A/D converter 20 which at the output-side of the magnetic field sensors 1a, 1b is connected to a second summing element 12b. This second summing element 12b serves for determining the component Vx of the output signal of the magnetic field sensors 1a, 1b, said component being produced only by the measurement current Ix, and subsequently this output signal component Vx, is digitalised in a second A/D converter 20. Parallel to the A/D conversion of Vx this signal also continues to be available in an analog manner.

The digital setting of the desired value by way of the desired value 8 and the fourth summing element 7 for the control loop which has already been described further above may also be optionally replaced by an analog desired value setting, and specifically by way of a further, fifth summing element 10 with an attenuator element 11 which is connected in front and which is connected to the auxiliary voltage generator 3. The fifth summing element 10 is arranged between the first summing element 12a and the correlator 6. On using this desired value setting, the connection 21a is interrupted and 21c connects the first summing element 12a to the fifth summing element 10. Furthermore, the connection 21b between the fourth summing element 7 and the digital regulator 21 is interrupted, and the first A/D converter 14 connects the lead 21d to the digital regulator 28.

Preferably the first A/D converter 14 is designed as a Σ/Δ-converter. It should have as little offset as possible (low offset A/D converter), wherein no great demands are required of it with regard to its processing speed. It behaves oppositely with the second A/D converter 20, which is not disturbed so much by an offset on account of subsequent computations but which however must be comparatively particularly quick.

What is essential with regard to the invention is the fact that the circuit arrangement described above is designed completely as an integrated circuit arrangement. Only the combination of the described desired value setting—in both designs Ns or Vz—and of the regulating variable elements 18 or 19 with a digital regulator 28 in the integrated circuit leads to a considerable improvement of the control (regulation) speed and the control (regulation) accuracy on compensating changes of the transfer factor of magnetic field sensors 1a, 1b, in particular with the detection of electrical currents which is necessary for calculation in electricity counter (meter) technology. This considerable improvement has not been known until now. Furthermore this integrated circuit according to the invention is particularly economically advantageous and also very easy to handle with regard to a sample scatter which in the following is explained in a more intensive manner with regard to the functioning manner of the whole integrated circuit arrangement.

It should however first be mentioned that the magnetic field sensors for example are designed as Hall generators or magneto-transistors.

Description of the Function of the Circuit Arrangement According to the Invention The circuit arrangement according to the invention serves for compensation changes of the transfer factors of magnetic field sensors. These changes are based on non-linearities which may be caused due to temperature fluctuation and agreeing. Furthermore it is significant that a sample scatter of various circuit arrangements of the type according to the invention may be counteracted in the simplest of manners.

The magnetic field sensors 1a, 1b detect the magnetic field Bx which is produced by a current Ix to be measured. A parallel auxiliary magnetic field Bt or an anti-parallel auxiliary magnetic field −Bt is superimposed on this magnetic field, and specifically in a manner such that Bt is detected by the magnetic field sensor 1a and −Bt by the magnetic field sensor 1b. Accordingly, the auxiliary magnetic field for one magnetic field sensor reduces the field by the amount of Bt, whilst for the other magnetic field sensor the field is increased by the amount of Bt.

The magnetic field sensors 1a and 1b are designed such that their output signals Vma and Vmb result as follows: For the magnetic field sensor 1a, Vma=0.5*(Vx+Vt) and Vmb=0.5*(Vx−Vt) for the magnetic field sensor 1b.

These output signals of the magnetic field sensors Vma, Vmb are processed as follows by way of a first summing element 12a:

$$Vma-Vmb=0.5*(Vx+Vt)-0.5*(Vx-Vt)=Vt$$

and on the output side of the first summing element 12a there results the component Vt which is produced exclusively by the auxiliary signal current It.

A further, second summing element 12b after the magnetic field sensors 1a, 1b leads to the output signal Vx with:

$$Vma+Vmb=0.5*(Vx+Vt)+0.5*(Vx-Vt)=Vx$$

This output signal Vx represents the measurement signal component of Vma or Vmb, and is based exclusively on the magnetic field Bx produced by the measurement current Ix.

Following the control loop for the compensation Vt, is led via the connection 21a to the correlator 6 which as a further input signal comprises the auxiliary voltage Vg of the auxiliary signal generator 3. The correlator output signal Vk is supplied to the A/D conversion 14 and subsequently as a digitalised signal Nk is led via the connection 21b to a desired value setting Ns at a fourth summing element 7. With this desired value setting Ns, a signal Nd=Nk−Ns is led to the digital regulator, and the digital regulator is operated in a manner such that as an output signal of the D/A transducer 17 connected thereafter there only results one variable regulating variable component Vd which is significantly smaller than the whole regulating variable used for the compensation, consisting of the variable regulating variable component (Vd or Id) and a constant regulating variable component (Vb or Is) to be added thereto.

In this manner the digital regulator 28 may be operated in a significantly smaller range in contrast to the state of the art, by which means its signal to noise ratio is considerably improved. The digital regulator by way of this is not only more exact but furthermore displays a considerably higher control speed.

According to this digital desired value setting Ns, likewise an analog desired value setting may be selected in front of the correlator 6 to replace this. For this it is the case that the connections 21a and 21b are interrupted, whilst the connections 21c and 21d are closed, wherein the digital regulator in its functioning is operated identically as with the digital desired value setting Ns.

Common to both desired value settings is the fact that they may be individually set. This leads to the further advantage that specifically in the new condition either the individually settable, attenuated auxiliary generator signal, the attenuator voltage Vz for short, or the individually settable desired value Ns are set such that the digital regulator 28 is set in the middle of its control (regulation) range. In this simple manner one may effect an adaptation of the complete circuit arrangement for the purpose of compensating a sample scatter of various circuit arrangements of the same type. These individually settable desired value settings Vs or Ns according to the invention thus permit a further reduction of the digital control (regulation) range and thus represent a further improvement with regard to accuracy and control speed.

A "direct compensation" or an "indirect compensation" of the change of the transfer factors of the magnetic field sensors 1a, 1b whilst taking into account the variable regulating variable component Vd is effected at the output side of the D/A transducer.

The Direct Compensation

With the direct compensation, the variable regulating variable component Vd is transformed in the first control element 19 by way of a voltage-controlled current source 19a into a variable regulating variable current component Id. Subsequently a constant regulating variable component Is is added to this variable regulating variable current component Id. The result is a control current signal Ir for the magnetic field sensors 1a, 1b for the purpose of directly influencing their transfer function The constant regulating variable component Is may selectively be taken from the auxiliary current source 19 or from the voltage-current transducer 4. This voltage-current transducer comprises a voltage-controlled current source 4b and a function circuit 4a from which the constant regulating variable current component Ig may be taken.

The Indirect Compensation

With the indirect compensation, in a second control element 18, a constant regulating variable component Vb by way of the third summing element 18a is directly added to the variable regulating variable component Vd. The regulating variable Vd+Vb is then led as a control signal Vrx to both A/D converters 14 and 20, by which means the indirect compensation of the change of the transfer function of the magnetic field sensors 1a, 1b is effected, specifically via the manipulation of the A/D converter connected after them.

In any case in the condition controlled to steady state, the follow applies for the whole control loop:

The attenuator voltage Vz is the same size as the auxiliary signal component Vt, or the digitalised correlator signal Nk is the same size as the digital desired value Ns.

Added to those advantages which have been achieved according to the invention, the circuit arrangement has a further advantage at the moment of switching on. With a compromise which favours the control speed and at the expense of the control accuracy, the transfer factor of the digital regulator 28 in a switch-on phase of 5 s is significantly increased in order to effect a quicker approximation of the [closed-loop] control. Subsequently then the resetting of the transfer factor of the digital regulator 28 is effected for permanent operation. This measure may be carried out in a particularly simple manner on account of the digital influence on the digital regulator.

The digital regulator itself comprises a digital integrator 29 and a latch bistable element 16 (latch, L). The complete circuit arrangement is controlled with respect to time via a cycle generator 16 (CL) which produces and emits cycle signals Fs for the A/D transducer 14 and 20, and F1 for the latch bistable element 15.

This invention claimed is:

1. A circuit arrangement for the compensation of changes of a transfer factor of a magnetic field sensor arrangement wherein the magnetic field sensor arrangement comprises an auxiliary signal generator, a voltage-current transducer and a coil arrangement for producing an first and a second auxiliary magnetic field which are superimposed upon a primary magnetic field to be measured by a first and second magnetic sensor, the magnetic field sensor arrangement further comprising a first summing element for determining a component of an output voltage of the first and second magnetic sensors produced by the auxiliary magnetic fields, the magnetic field sensor arrangement further comprising a correlator that provides a correlator output signal based upon the auxiliary magnetic fields voltage component and the output of the auxiliary signal generator, the circuit arrangement comprising:

an integrated circuit arrangement with
a first analog to digital converter with an input operably connected to the output of the correlator and operable to output a digital correlator signal based upon the correlator output signal, a digital regulator with an input operably connected in series with the output of the first analog to digital converter and operable to generate a variable digital regulating signal based upon the digital correlator signal, a digital to analog converter with an input operably connected in series with the output of the digital regulator and operable to output a variable regulating component based upon the output of the digital regulator, and a control element with an input operably connected in series with the output of the digital to analog converter, and operable to output a control signal based upon a summation of the variable regulating component from the digital to analog converter and a constant regulating component, wherein the output of the control element is operably connected to the first and second magnetic sensors, such that a transfer factor of the first magnetic sensor and a transfer factor of the second magnetic sensor are influenced by the control signal, wherein the control element comprises, a voltage-controlled current source operably connected to the input of the control element and operable to generate a variable regulating current component based upon the variable regulating component from the digital to analog converter;

a constant regulating current source operable to output a constant regulating current component; and a second summing element operably connected to the output of the voltage-controlled current source and the constant regulating current source and operable to generate the control signal based upon the sum of the variable regulating current component and the constant regulating current component.

2. The circuit arrangement of claim 1, wherein the constant regulating current source comprises:

an auxiliary current source.

3. The circuit arrangement of claim 1, wherein the constant regulating current source comprises:

the voltage-current transducer.

4. A circuit arrangement for the compensation of changes of a transfer factor of a magnetic field sensor arrangement wherein the magnetic field sensor arrangement comprises an auxiliary signal generator, a voltage-current transducer and a coil arrangement for producing an first and a second auxiliary magnetic field which are superimposed upon a primary magnetic field to be measured by a first and second magnetic sensor, the magnetic field sensor arrangement further comprising a first summing element for determining a component of an output voltage of the first and second magnetic sensors produced by the auxiliary magnetic fields, the magnetic field sensor arrangement further comprising a correlator that provides a correlator output signal based upon the auxiliary magnetic fields voltage component and the output of the auxiliary signal generator the circuit arrangement comprising:

an integrated circuit arrangement with
- a first analog to digital converter with an input operably connected to the output of the correlator and operable to output a digital correlator signal based upon the correlator output signal,
- a digital regulator with an input operably connected in series with the output of the first analog to digital converter and operable to generate a variable digital regulating signal based upon the digital correlator signal,
- a digital to analog converter with an input operably connected in series with the output of the digital regulator and operable to output a variable regulating component based upon the output of the digital regulator, and
- a control element with an input operably connected in series with the output of the digital to analog converter, and operable to output a control signal based upon a summation of the variable regulating component from the digital to analog converter and a constant regulating component, wherein, the magnetic field sensor arrangement further comprises a third summing element operably connected to the outputs of the first and second magnetic sensors and operable to sum the outputs of the first and second magnetic sensors to generate an output voltage component based upon the primary magnetic field; and the integrated circuit further comprises a second analog to digital converter with an input operably connected to the output of the third summing element and operable to generate a digital output voltage component based upon the primary magnetic field output voltage component; and the output of the control element is operably connected to the first analog to digital converter and the second analog to digital converter such that the transfer factor of the first magnetic sensor and the transfer factor of the second magnetic sensor are indirectly compensated for by the control signal.

5. The circuit arrangement of claim 4, wherein the control element comprises:
- an auxiliary voltage source operable to generate a constant auxiliary voltage component; and
- a fourth summing element operably connected to the output of the auxiliary voltage source and the input of the control element and operable to generate the control signal based upon the sum of the constant auxiliary voltage component and the variable regulating component.

6. The circuit arrangement of claim 5, wherein the integrated circuit further comprises:
a fifth summing element having a first input operably connected to the output of the first analog to digital converter, a second input operably connected to a desired value generator, and an output operably connected to the digital regulator, the fifth summing element operable to sum a digital desired value signal from the desired value generator and the digital correlator signal from the output of the first analog to digital converter and provide the summed signal to the input of the digital regulator.

7. The circuit arrangement of claim 4, wherein the integrated circuit further comprises:
a fifth summing element having a first input operably connected to the output of the first analog to digital converter, a second input operably connected to a desired value generator, and an output operably connected to the digital regulator, the fifth summing element operable to sum a digital desired value signal from the desired value generator and the digital correlator signal from the output of the first analog to digital converter and to provide the summed signal to the input of the digital regulator.

8. The circuit arrangement of claim 4, further comprising:
an attenuator having an input operably connected to the output of the auxiliary signal generator and operable to generate an attenuator voltage based upon the auxiliary signal generated by the auxiliary signal generator; and
a sixth summing element having a first input operably connected to the output of the first summing element, a second input operably connected to the attenuator output, and an output operably connected to the correlator, the sixth summing element operable to sum an analog desired value signal from the attenuator voltage and the auxiliary magnetic fields voltage component and to provide the summed signal to the input of the correlator, such that the correlator correlates the summed signal with the output of the auxiliary signal generator.

9. The circuit arrangement of claim 4, wherein the first analog to digital converter is $\Sigma/\Delta$ modulator.

* * * * *